United States Patent [19]
Barrett, Jr.

[11] Patent Number: 5,361,040
[45] Date of Patent: Nov. 1, 1994

[54] SELF LIMITING AND SELF BIASING OPERATIONAL TRANSCONDUCTANCE AMPLIFIER

[75] Inventor: Raymond L. Barrett, Jr., Ft. Lauderdale, Fla.

[73] Assignee: Motorola, Inc., Schaumburg, Ill.

[21] Appl. No.: 138,117

[22] Filed: Oct. 20, 1993

[51] Int. Cl.$^5$ ............................................. H03F 3/45
[52] U.S. Cl. .................................. 330/253; 330/257; 330/258; 330/311
[58] Field of Search ................. 330/253, 257, 258, 311

[56] References Cited

U.S. PATENT DOCUMENTS

| | | | |
|---|---|---|---|
| 4,267,517 | 5/1981 | Iida et al. | 330/258 X |
| 4,538,115 | 8/1985 | Butler | 330/311 X |
| 5,128,630 | 7/1992 | Mijuskovic | 330/258 X |

OTHER PUBLICATIONS

Gregorian and Temes, Analog MOS Integrated Circuits for Signal Processing, High Performance CMOS OP-Amps, 1986, pp. 251–257.

Primary Examiner—James B. Mullins
Attorney, Agent, or Firm—Keith A. Chanroo; Thomas G. Berry

[57] ABSTRACT

An operational transconductance amplifier (38) is coupled to first and second supply voltages (41, 42) for converting differential input signals into a proportional output current. The operational transconductance amplifier (38) has a predetermined common mode input range, and a differential amplifier input stage (28, 29) having a non-inverting input (Vin+), and an inverting input (Vin−). The non-inverting and inverting inputs (Vin+, Vin−) receives differential input signals. Parallel connected transistors (36, 37) are coupled to the differential amplifier input stage (28, 29) for receiving the differential input signals. A current mirror (20–23) has first and second current paths, wherein the first current path sinks a common mode current from the differential amplifier stage, and wherein the second current path diverts the common mode current from the differential amplifier input stage (28, 29) in the event that the differential input signals fall below a predetermined magnitude.

11 Claims, 1 Drawing Sheet

SELF LIMITING AND SELF BIASING OPERATIONAL TRANSCONDUCTANCE AMPLIFIER

FIELD OF THE INVENTION

This invention relates generally to electronic circuits, and more particularly to an operational amplifier having improved bias and current drain characteristics.

BACKGROUND OF THE INVENTION

Operational amplifiers are widely used in the electronics industry because of their many excellent circuit characteristics including high open loop gain, high input impedance, and low output impedance. Operational transconductance amplifiers are similar to the operational amplifiers generally, but exhibit high output impedance. General applications of operational amplifiers include circuit configurations such as voltage and current amplifiers, differentiators and integrators, active filters, oscillators, and analog-to-digital and digital-to-analog converters. To realize these different circuit configurations, operational amplifiers are used in conjunction with positive and/or negative feedback combined with passive and/or active elements.

An operational amplifier is also widely used to function as a voltage comparator, wherein typically, a reference signal is applied to the inverting input, and the voltage to be compared is applied to the non-inverting input. If the magnitude of the voltage to be compared is greater than the magnitude of the reference signal, the output of the comparator equals the positive supply voltage. If the magnitude of the voltage to be compared is less than the magnitude of the reference voltage, the output of the comparator equals the negative or ground supply voltage. An inverted voltage comparator may be provided by simply transposing the signals at the inverting and non-inverting inputs. Using the operational amplifier as a voltage comparator requires no external components or feedback, and its output only has two states: high and low.

The operational amplifier, as utilized in the realization of a variety of circuit functions, may be manufactured in bipolar or Complementary Metal Oxide Semiconductor (CMOS) technology or some combination thereof. The CMOS implementation is desirable for its low power consumption characteristic. Also, operational amplifiers are increasingly being integrated onto chips which merge digital and analog functions together with an increasing number of devices.

Current operational amplifiers require bias voltages that are not equal to the available supply voltages. Hence, the bias voltages must be provided, either at an input pin to the operational amplifier, or in the case of an integrated operational amplifier, additional circuitry must be incorporated therein to provide the proper bias voltage magnitudes. Using an external input presents problems similar to those for the null offset, and the internal circuitry is subject to statistical process variations across the integrated circuit.

Still further, should the magnitude of the differential input voltages drop below a threshold of the bias voltages, then an undesirably high common mode current, internal to the operational amplifier circuitry, might flow, depending upon the given circuit application. Such common mode current presents a drain of battery power, which for many applications, such as in radio pagers, is to be avoided since battery life is a major design concern. One method of ensuring the common mode current does not drain the battery needlessly is to provide additional safeguard to ensure that the input voltages never fall out of a given range. This is not always feasible or economical.

Thus, what is needed is an operational amplifier that does not require additional circuitry for each bias voltage and has a mechanism for ensuring that the common mode current does not unnecessarily drain power when an input voltage magnitude falls below a bias voltage magnitude.

SUMMARY OF THE INVENTION

According to a preferred embodiment of the invention, an operational amplifier comprises a folded cascode differential input amplifier stage adapted for receiving first and second differential input signals. A current deflector circuit coupled to the folded cascode differential input amplifier stage is adapted for receiving the first and second differential input signals. An output circuit also coupled to the folded cascode differential input amplifier stage provides an output signal indicative of a difference between the first and second differential input signals.

DESCRIPTION OF A PREFERRED EMBODIMENT

Figure 1:
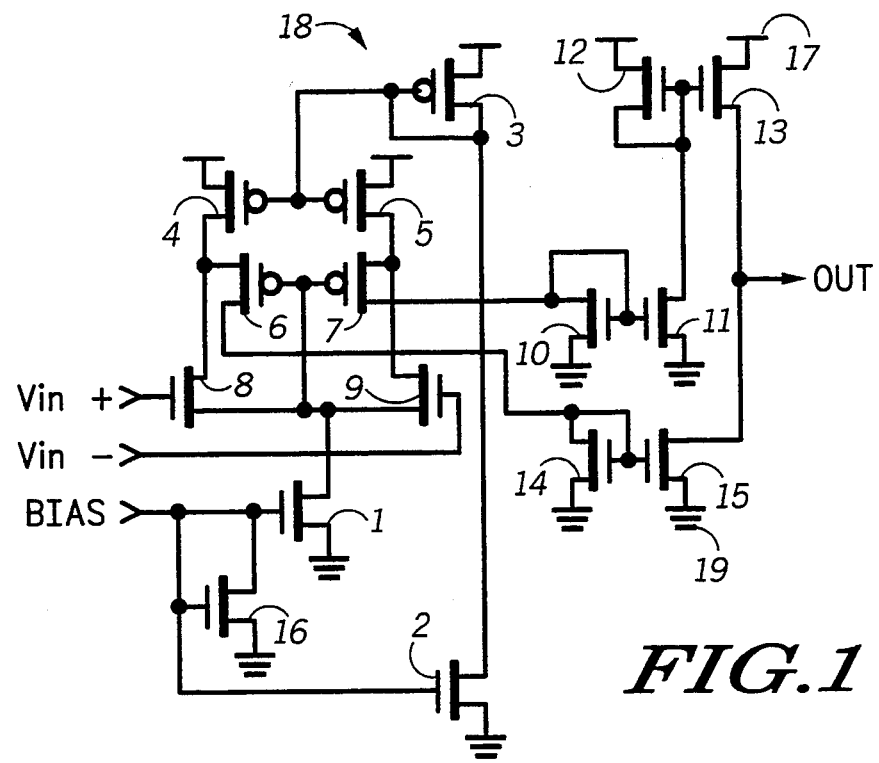
FIG. 1 is a schematic diagram of an operational amplifier having self bias according to a preferred embodiment of the present invention.

FIG. 1 illustrates a folded cascode operational amplifier 18 having self biased folded transistors 6 and 7. Transistors 1 through 9 and 16 operate as a folded cascode differential input amplifier wherein a gate of the folded transistors 6 and 7 have historically been coupled to a bias voltage for setting an operational parameter of the folded cascode operational amplifier 18. Providing such a bias voltage required the use of additional devices to derive the proper magnitude from the available supply voltages 17 and 19. These additional devices increase the complexity of the folded cascode operational amplifier 18 and reduce circuit accuracy by presenting additional circuit tolerances. The folded cascode operational amplifier 18 is improved by removing the need for the external bias voltage to the folded transistors 6 and 7 by connecting the gates of the folded transistors 6 and 7 to the sources of the transistors 8 and 9.

The transistors 8 and 9 are connected as a differential input pair wherein a gate of the transistor 8 is connected for receiving a non-inverting differential input signal, Vin+, and a gate of the transistor 9 is connected for receiving an inverting differential input signal, Vin−. A current mirror, made up of transistors 1 through 5 and 16 are biased by a bias current, BIAS, connected to the gates of the transistors 1, 2 and 16. The bias current, BIAS, external to the folded cascode operational amplifier 18, establishes a reference voltage substantially equal to a gate-to-source voltage (Vgs) of the transistor 16 according to a magnitude of the bias current, BIAS. Transistors 1 and 2 are then constrained to share the same Vgs magnitude as that of the transistor 16 which in turn causes currents flowing through the transistors 1 and 2 to be proportional (according to the width/length geometry ratios of the transistors 1, 2 and 16) to a current flowing in the transistor 16. The current flowing in the transistor 16 is the sum of the currents flowing in the differential transistors 8 and 9.

A mirror current flowing in the transistor 3 causes a proportional mirrored current to flow in the transistors 4 and 5, the mirrored currents being determined by the transistor 3 and the transistors 4 and 5 geometries. The geometries of the transistors 4 and 5 are designed such that the mirrored currents flowing therein are greater than the current flowing in the transistor 1, and hence greater than the common mode currents flowing in the differential transistors 8 and 9. The mirrored currents, common mode currents, and differential mode currents (flowing in the folded transistors 6 and 7) are summed at a junction formed by a drain of the transistor 4, a source of the transistor 6, and a drain of the transistor 8 (and similarly at another junction formed by a drain of the transistor 5, a source of the transistor 7 and a drain of the transistor 9).

As stated above, the mirrored current (the sum of the currents flowing in the transistors 4 and 5) is proportional to and exceeds the common mode current flowing in the differential transistors 8 and 9. Hence, the excess mirrored current is established in the folded transistors 6 and 7 and flows to an output driver made up of transistors 10 through 15. The differential current provides a measurement of a difference in the differential input signals. The output driver receives both equal portions of the common mode currents and the entire differential mode current from the drains of the folded transistors 6 and 7 and provides a single output, OUT. For example, the current flowing through transistors 12 and 13 is equal to the common mode current plus half the differential mode current, and the current flowing through transistors 14 and 15 equals the common mode minus half the differential mode which is 180 degrees out of phase of the current flowing through transistors 12 and 13. The output, OUT, is the sum of the currents through transistors 12 through 15 which is equal to the total differential mode current.

Vgs values for the differential transistors 8 and 9 are established for a nominal common mode current, as are the Vgs values for the folded transistors 6 and 7. The gates of the folded transistors are connected to common connected sources of the differential transistors 8 and 9 for ensuring that a common mode voltage, Vds (drain-to-source voltage), of the differential transistor 8 is substantially equal to a common mode voltage, Vds, of the folded transistor 6. Likewise, a common mode voltage, Vds, of the differential transistor 9 is substantially equal to a common mode voltage, Vds, of the folded transistor 7. Thus, the bias conditions are established by relative transistor geometries of the pairs of differential and folded transistors, 8 and 9, and 6 and 7 respectively. Advantageously, a separate bias input is not required to bias the folded transistors 6 and 7, but instead existing circuit nodes are used.

Eliminating additional devices for providing a bias voltage reduces the complexity of the folded cascode operational amplifier. The folded cascode operational amplifier 18 is therefore improved by connecting the gates of the folded transistors 6 and 7 to the sources of the transistors 8 and 9. In this way, the need to incorporate additional circuitry to provide bias voltages that are not equal to the available supply voltages is eliminated. Also, the problems presented by using an external input similar to those for the null offset and statistical process variations are eliminated.

In summary, an operational amplifier comprises a folded cascode differential input amplifier stage adapted for receiving first and second differential input signals. The folded cascode differential input amplifier stage comprises a current mirror for receiving a first bias signal for setting a common mode current. First and second folded transistors generate a differential current and receive a second bias signal. A current deflector circuit coupled to the folded cascode differential input amplifier stage is adapted for receiving the first and second differential input signals. An output circuit coupled to the folded cascode differential input amplifier stage provides an output signal indicative of a difference between the first and second differential input signals. The output circuit receives first and second difference currents from the first and second folded transistors, respectively, and converts the first and second difference currents into a single output current proportional thereto.

Figure 2:
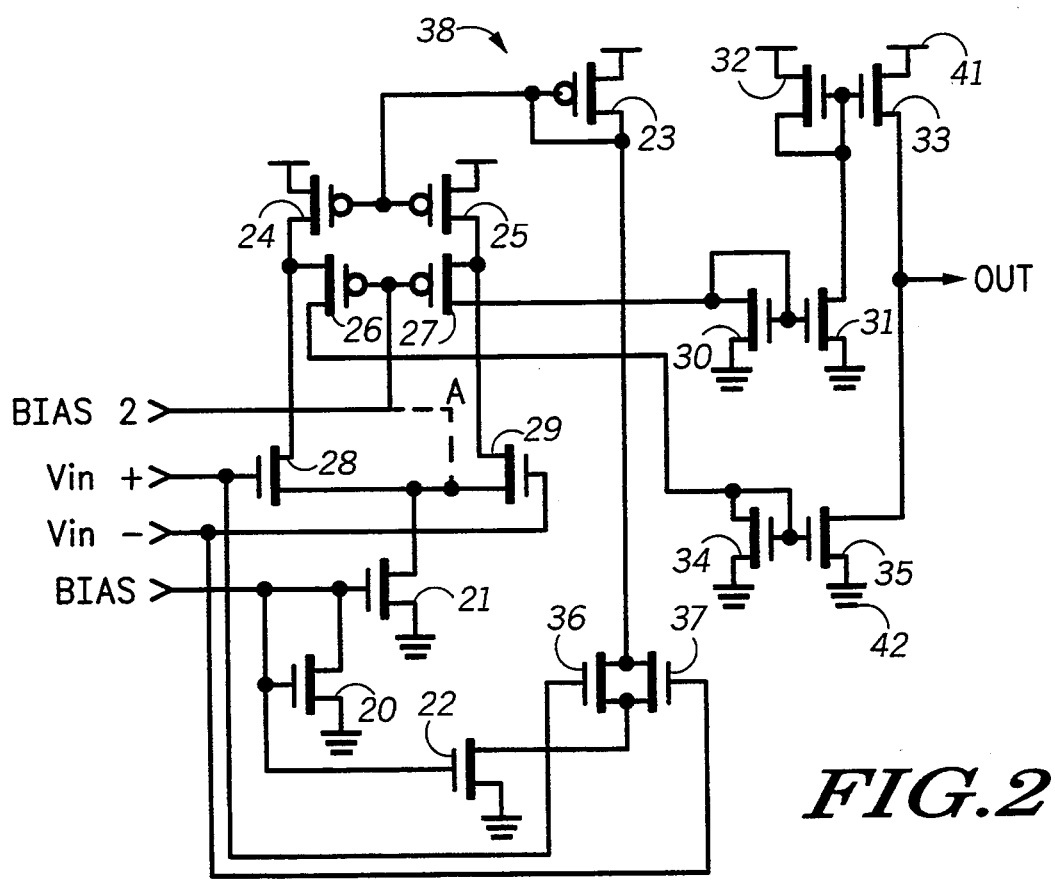
FIG. 2 is a schematic diagram of an operational amplifier comprising a self bias and common mode current drain control according to a preferred embodiment of the present invention.

FIG. 2 depicts a self limiting folded cascode operational amplifier 38 that automatically prevents undesirable common mode currents from occurring due to out-of-range common mode input voltages. The self limiting folded cascode operational amplifier 38 operates similarly to the folded cascode operational amplifier 18 (FIG. 1) with the addition of a current diverting circuit made up of transistors 36 and 37. A differential input stage includes transistors 28 and 29, each having a gate connected to a non-inverting, Vin+, and inverting, Vin−, differential input, respectively. Folded transistors 26 and 27 have gates connected to a signal, BIAS 2. Alternatively, the folded transistors 26 and 27 may have their gates connected to the sources of the transistors 28 and 29, thus providing self bias.

A current mirror circuit, includes transistors 20 through 23, operates similarly to the current mirror discussed in FIG. 1. A bias input current sets the parameters for the current mirror as is well known by those skilled in the art. Included in the current mirror is a diverting circuit made up of parallel connected transistors 36 and 37. A gate of the transistor 36 is connected to the non-inverting input, Vin+; and a gate of the transistor 37 is connected to the inverting signal, Vin−. Sources and drains of the transistors 36 and 37 are coupled between the transistor 23 and the transistor 22. The transistors 36 and 37 are identically sized as the transistors 28 and 29 and further share the current in the transistor 22. The transistors 36 and 37 thus provide a reference current substantially equal to the common mode current in the differential transistors 28 and 29. The self limiting action of the operational transconductance amplifier 38 is accomplished by the action of the transistors 36 and 37. In operation, the transistors 36 and 37 reduce the magnitude of the current flowing in the transistors 23, 24 and 25 whenever the common mode current in the differential transistors 28 and 29 is reduced due to the input common mode voltage falling below a threshold of the input differential transistors 28 and 29. Current reduction is ensured by biasing the transistors 36 and 37 with the same common mode current, and connecting the transistors 36 and 37 in parallel with the differential transistors 28 and 29 such that the transistors experience the same common mode and differential mode signals.

The output circuit includes transistors 30 through 35 connected to the folded transistors 26 and 27. The output circuit made up of transistors 30 through 35 is similar in operation to the output circuit of FIG. 1 and being coupled to supply voltages 41, 42.

In this way, the self limiting folded cascode operational amplifier 38 with the current diverting circuit made up of transistors 36 and 37 automatically prevents undesirable common mode currents from occurring due to out-of-range common mode input voltages. Operationally, transistors 36 and 37 reduce the magnitude of the current flowing in the transistors 23, 24 and 25 whenever the common mode current in the differential transistors 28 and 29 is reduced due to the input common mode voltage falling below a threshold of the input differential transistors 28 and 29. Current reduction is ensured by biasing the transistors 36 and 37 with the same common mode current, and connecting the transistors 36 and 37 in parallel with the differential transistors 28 and 29 such that the transistors experience the same common mode and differential mode signals.

Although the present invention has been described in relation to particular embodiments thereof, many other variations and modifications and other uses will become apparent to those skilled in the art. Therefore, the present invention is limited only by the claims.

In summary, an operational transconductance amplifier is coupled to first and second supply voltages for converting an input voltage into a proportional output current. The operational transconductance amplifier has a predetermined common mode input range, and further comprises a differential amplifier input stage having a non-inverting input and an inverting input. The non-inverting and inverting inputs receive differential input signals. The differential amplifier input stage comprises folded transistors cascode coupled thereto for generating a differential current, and first and second differential transistors. Parallel connected transistors are coupled to the differential amplifier input stage for receiving the differential input signals. The parallel connected transistors are sized substantially the same as the first and second differential transistors. A current mirror has first and second current paths. The first current path sinks a common mode current from the differential amplifier stage and the second current path diverts the common mode current from the differential amplifier if the differential input signals fall below a predetermined magnitude.

What is claimed is:

1. An operational amplifier, comprising:
   a first folded cascode input amplifier stage coupled with a second folded cascode input amplifier stage forming a folded cascode differential input amplifier adapted for receiving first and second differential input signals, the folded cascode differential input amplifier establishing a self-biasing point from the first and second differential input signals at a common source thereof for providing an internally generated bias for self-biasing the first and second folded cascode input amplifier stages;
   a current deflector circuit coupled to said first and second folded cascode input amplifier stages and adapted for receiving the first and second differential input signals; and
   an output circuit coupled to said first and second folded cascode input amplifier stages for providing an output signal indicative of a difference between the first and second differential input signals.

2. The operational amplifier according to claim 1, wherein the folded cascode differential input amplifier comprises a current mirror, the current mirror receiving a first bias signal for setting a common mode current.

3. The operational amplifier according to claim 2, wherein the folded cascode differential input amplifier generating a differential current which establishes the self-biasing point at the common source for providing the internally generated self-bias for the first and second folded cascode input amplifier stages.

4. The operational amplifier according to claim 3 wherein the current deflector circuit comprises parallel connected first and second transistors.

5. The operational amplifier according to claim 3 wherein the output circuit receives first and second difference currents from the first and second folded cascode input amplifier stages, respectively, and converts the first and second difference currents into a single output current proportional thereto.

6. An operational transconductance amplifier coupled to first and second supply voltages for converting an input voltage into a proportional output current and having a predetermined threshold of common mode input range, the operational transconductance amplifier comprising:
   a first folded cascode input amplifier stage coupled with a second folded cascode input amplifier stage forming a folded cascode differential input amplifier, the folded cascode differential input amplifier establishing a self-biasing point from first and second differential input signals at a common source thereof for providing an internally generated bias for self-biasing the first and second folded cascode input amplifier stages;
   the differential input amplifier having a non-inverting input and an inverting input, the non-inverting and inverting inputs receiving the first and second differential input signals;
   parallel connected transistors coupled to the differential amplifier input stage and receiving the first and second differential input signals; and
   a current mirror having first and second current paths for providing a diverting circuit which automatically prevents undesirable common mode currents from occurring due to an out of range first and second differential input signals, the first current path sinking a common mode current from the differential input amplifier, the second current path diverting the common mode current from the differential input amplifier in the event that the first and second differential input signals fall below the predetermined threshold of common mode input range.

7. The operational transconductance amplifier according to claim 6 wherein the differential input amplifier comprises folded transistors.

8. The operational transconductance amplifier according to claim 6 wherein the differential input amplifier comprises first and second differential transistors.

9. The operational transconductance amplifier according to claim 8 wherein the parallel connected transistors are sized substantially the same as the first and second differential transistors.

10. An operational amplifier, comprising:
    a first folded cascode input amplifier stage coupled with a second folded cascode input amplifier stage forming a folded cascode differential input amplifier adapted for receiving first and second differential input signals, the folded cascode differential input amplifier establishing a self-biasing point from the first and second differential input signals at a common source thereof for providing an internally generated bias for self-biasing the first and second folded cascode input amplifier stages; the folded cascode differential input amplifier comprises:

a current mirror for receiving a first bias signal for setting a common mode current; and first and second folded transistors for generating a differential current, the first and second folded transistors receiving a second bias signal from the self-biasing point at the common source;

a current deflector circuit coupled to said first and second folded cascode input amplifier stages and adapted for receiving the first and second differential input signals; and an output circuit coupled to said first and second folded cascode input amplifier stages for providing an output signal indicative of a difference between the first and second differential input signals, the output circuit receives first and second difference currents from the first and second folded transistors, respectively, and converts the first and second difference currents into a single output current proportional thereto.

11. An operational transconductance amplifier coupled to first and second supply voltages for converting an input voltage into a proportional output current and having a predetermined common mode input range, the operational transconductance amplifier comprising:

a first folded cascode input amplifier stage coupled with a second folded cascode input amplifier stage forming a folded cascode differential input amplifier, the folded cascode differential input amplifier establishing a self-biasing point from first and second differential input signals at a common source thereof for providing an internally generated bias for self-biasing the first and second folded cascode input amplifier stages;

the differential input amplifier having a non-inverting input, and an inverting input, the non-inverting and inverting inputs receiving the first and second differential input signals, the differential input amplifier comprises:

folded transistors cascode coupled thereto for generating a differential current; and first and second differential transistors;

parallel connected transistors coupled to the differential input amplifier and receiving the first and second differential input signals, the parallel connected transistors are sized substantially the same as the first and second differential transistors; and a current mirror having first and second current paths, the first current path sinking a common mode current from the differential input amplifier, the second current path diverting the common mode current from the differential input amplifier in the event that the differential input signals fall below a predetermined magnitude.

* * * * *